United States Patent
Buttolo et al.

(10) Patent No.: US 10,461,746 B2
(45) Date of Patent: Oct. 29, 2019

(54) PROXIMITY SWITCH ASSEMBLY AND METHOD THEREFOR

(71) Applicant: Ford Global Technologies, LLC, Dearborn, MI (US)

(72) Inventors: Pietro Buttolo, Dearborn Heights, MI (US); Stuart C. Salter, White Lake, MI (US); Satyanarayana Raju Vemulapati, Westland, MI (US); James Stewart Rankin, II, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 93 days.

(21) Appl. No.: 15/926,228

(22) Filed: Mar. 20, 2018

(65) Prior Publication Data

US 2019/0296738 A1 Sep. 26, 2019

(51) Int. Cl.
| | | |
|---|---|---|
| H03K 17/955 | (2006.01) | |
| H03K 17/96 | (2006.01) | |
| G06F 3/044 | (2006.01) | |
| H03K 17/945 | (2006.01) | |

(52) U.S. Cl.
CPC ........... H03K 17/955 (2013.01); G06F 3/044 (2013.01); H03K 17/962 (2013.01); *H03K 2017/9455* (2013.01); *H03K 2217/945* (2013.01); *H03K 2217/94026* (2013.01); *H03K 2217/960755* (2013.01)

(58) Field of Classification Search
CPC ..... H03K 17/955; H03K 2217/960705; H03K 2217/94026; H03K 2217/94052; H03K 17/945; H03K 2217/960755; H03K 17/962; H03K 2217/94031; H03K 2017/9602; H03K 17/96; H03K 2217/945; G06F 3/016; G06F 3/03547; G06F 11/30; G06F 2203/04108; G06F 3/044

See application file for complete search history.

(56) References Cited

U.S. PATENT DOCUMENTS

| | | |
|---|---|---|
| 8,537,107 B1 | 9/2013 | Li |
| 8,933,708 B2 | 1/2015 | Buttolo et al. |
| 9,287,864 B2 | 3/2016 | Buttolo et al. |
| 9,660,644 B2 | 5/2017 | Buttolo et al. |
| 2009/0009482 A1 | 1/2009 | McDermid |
| 2012/0126941 A1 | 5/2012 | Coggill |
| 2013/0018489 A1* | 1/2013 | Grunthaner ............. G06F 3/041 700/73 |

(Continued)

OTHER PUBLICATIONS

"Touch Sensors Design Guide" by ATMEL, 10620 D-AT42-04/09, Revised Apr. 2009, 72 pages, Copyrighted 2008-2009 Atmel Corporation.

*Primary Examiner* — Hong Zhou
(74) *Attorney, Agent, or Firm* — Vichit Chea; Price Heneveld LLP (57) ABSTRACT

A proximity switch assembly is provided. The proximity switch assembly includes a proximity switch comprising a proximity sensor providing an activation field, and control circuitry monitoring a signal responsive to the activation signal and determining an activation of the switch, detecting a first peak value above a threshold when the signal is not stable followed by a drop and a subsequent rise to a second peak value followed by a sharp drop.

15 Claims, 6 Drawing Sheets

(56) References Cited

U.S. PATENT DOCUMENTS

| | | | |
|---|---|---|---|
| 2013/0057506 A1* | 3/2013 | Hu | G06F 3/0416 |
| | | | 345/174 |
| 2014/0210257 A1* | 7/2014 | Buttolo | H03K 17/955 |
| | | | 307/9.1 |
| 2015/0084874 A1* | 3/2015 | Cheng | G06F 3/04883 |
| | | | 345/173 |
| 2015/0130742 A1* | 5/2015 | Chen | G06F 3/044 |
| | | | 345/174 |
| 2016/0112044 A1* | 4/2016 | Salter | H03K 17/955 |
| | | | 307/116 |
| 2017/0285866 A1* | 10/2017 | Heim | G06F 3/0418 |

* cited by examiner

PROXIMITY SWITCH ASSEMBLY AND METHOD THEREFOR

FIELD OF THE INVENTION

The present invention generally relates to switches, and more particularly relates to proximity switches providing enhanced determination of switch activation.

BACKGROUND OF THE INVENTION

Automotive vehicles are typically equipped with various user actuatable switches, such as switches for operating devices including powered windows, headlights, windshield wipers, moonroofs or sunroofs, interior lighting, radio and infotainment devices, and various other devices. Generally, these types of switches need to be actuated by a user in order to activate or deactivate a device or perform some other type of control function. Proximity switches, such as capacitive switches, generally employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on a comparison of the sense activation field to a threshold.

Capacitive sensors may be manufactured with conductive circuitry formed on a plastic substrate that may serve as a touch pad and may suffer from mechanical deformation due to a user pressing on the touch pad. Mechanical deformation may affect the capacitive sensor geometry as the sensor circuitry is forced to stretch and change shape. Additionally, air pockets might be introduced between the sensor circuitry and the deformable touch pad. Changes in the sensor assembly and mechanical properties may affect the capacitive signal as the sensor is pressed with increased force which may result in false activations.

Accordingly, it is desirable to provide for a proximity switch arrangement which enhances the use of proximity switches by a person, particularly for a driver or passenger in a vehicle. It is further desirable to provide for a proximity switch arrangement that reduces or prevents false activations due to mechanical deformations of the sensor.

SUMMARY OF THE INVENTION

According to one aspect of the present invention, a proximity switch assembly is provided. The proximity switch assembly includes a proximity switch comprising a proximity sensor providing an activation field, and control circuitry monitoring a signal responsive to the activation signal and determining an activation of the switch based on detecting a first peak value above a threshold when the signal is not stable, followed by a drop and a subsequent rise to a second peak value followed by a sharp drop.

Embodiments of the first aspect of the invention can include any one or a combination of the following features:
- the control circuitry further delays recalibration of the switch assembly by a predetermined time period when the signal is detected dropping fast;
- the delay in recalibration is at least two seconds;
- the control circuitry further determines the signal drops below a baseline value;
- the drop from the first peak value exceeds a noise threshold;
- the drop from the first peak value exceeds at least twice the noise threshold
- the proximity sensor comprises a sensor circuit formed on a flexible substrate;
- the proximity switch comprises a capacitive switch comprising a capacitive sensor; and
- the proximity switch is installed in a vehicle for use by a passenger of the vehicle.

According to another aspect of the present invention, a method of determining activation of a proximity switch is provided. The method includes the steps of generating an activation field with a proximity sensor, monitoring amplitude of a signal generated in response to the activation field, detecting a first peak value of the signal when the signal is not stable, followed by a drop in the signal, then a subsequent rise to a second peak value, followed by a sharp drop below a baseline value, and determining an activation of the switch based on the detecting step.

Embodiments of the second aspect of the invention can include any one or a combination of the following features:
- the step of delaying recalibration of the switch by a fixed time when the signal drops below the baseline value;
- the delay in recalibrating is at least two seconds;
- the drop from the first peak value exceeds a noise threshold;
- the drop from the first peak value exceeds at least twice the noise threshold;
- the proximity sensor comprises a sensor circuit formed on a flexible substrate;
- the proximity switch comprises a capacitive switch comprising a capacitive sensor; and
- the proximity switch is installed on a vehicle for use by a passenger in the vehicle.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
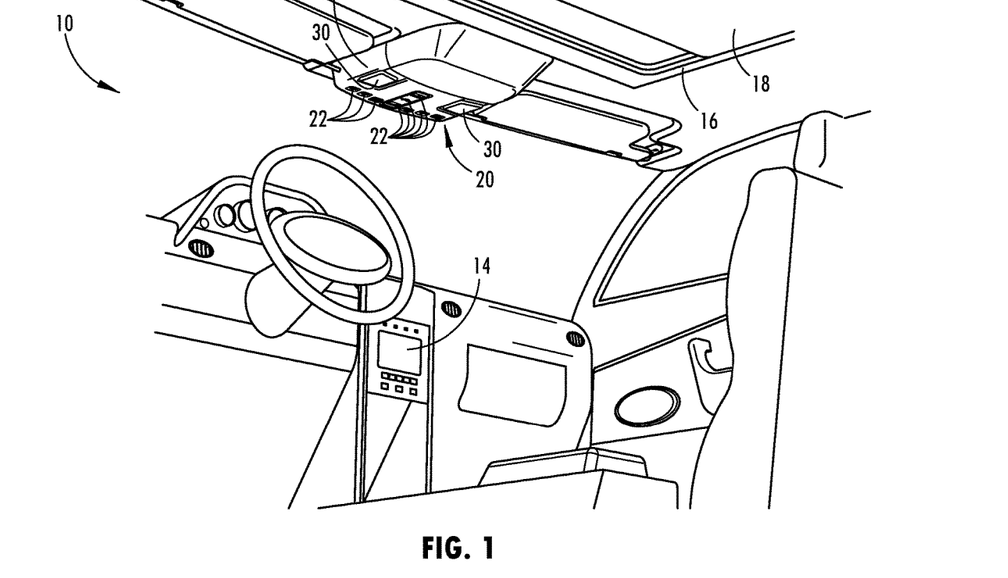
FIG. 1 is a perspective view of a passenger compartment of an automotive vehicle having an overhead console employing a proximity switch assembly, according to one embodiment.
Figure 2:
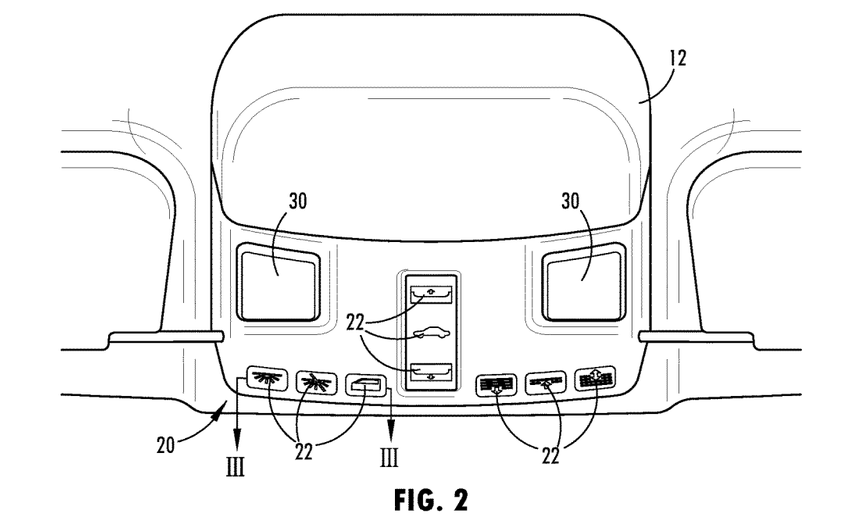
FIG. 2 is an enlarged view of the overhead console and proximity switch assembly shown in FIG. 1.

Referring to FIGS. 1 and 2, the interior of an automotive vehicle 10 is generally illustrated having a passenger compartment and a switch assembly 20 employing a plurality of proximity switches 22 having switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or more proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 may each provide control of a vehicle component or device or other designated control function. One or more of the proximity switches 22 may be dedicated to controlling movement of a sunroof or moonroof 16 so as to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
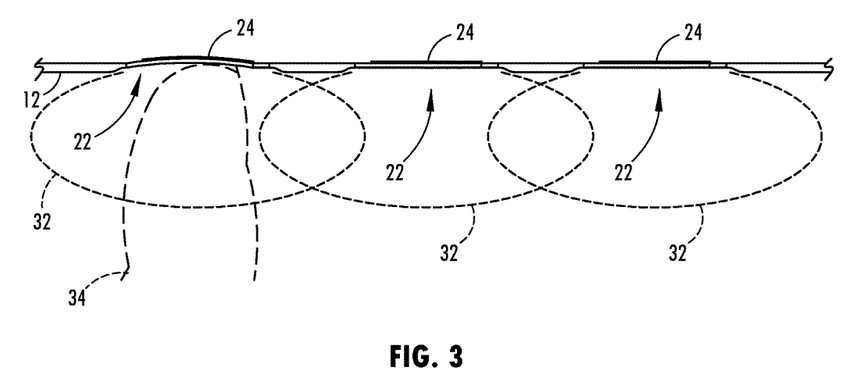
FIG. 3 is an enlarged cross-sectional view taken through line in FIG. 2 showing an array of proximity switches in relation to a user's finger.
Figure 4:
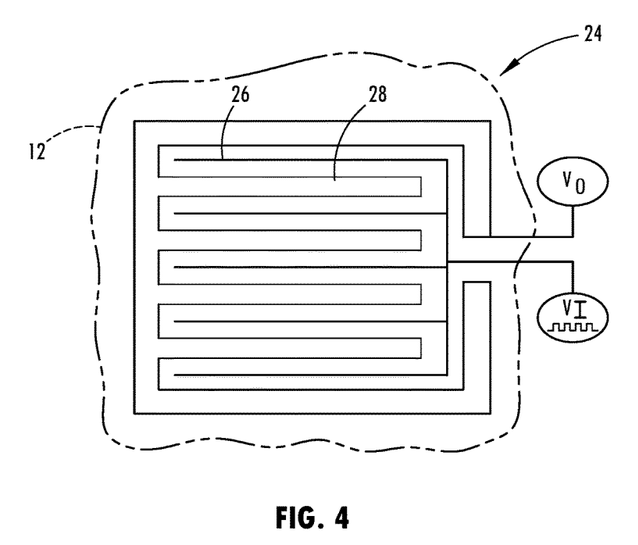
FIG. 4 is a schematic diagram of a capacitive sensor located on the top surface of a flexible substrate touchpad employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 contacting one of the switches during use of the switch assembly 20. Each proximity switch 22 includes one or more proximity sensors 24 for generating a sense activation field. According to one embodiment, each of the proximity sensors 24 may be formed by printing conductive ink onto the top surface of a touch pad shown in one example provided by the polymeric overhead console 12. One example of a printed ink proximity sensor 24 formed on a touch pad is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments.

The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32 for each respective sensor.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating a signal based on charge pulse counts which is processed as discussed herein.

The proximity sensors 24 are shown in FIGS. 3 and 4 formed on a back or top surface of a substrate such as the polymeric overhead console 12 which provides touch pads on the front or bottom surface. The polymeric overhead console 12 may be a thin polymeric sheet that is flexible and may bend when force is applied in a direction perpendicular to the sheet. When a user's finger 34 presses on the bottom surface of a touch pad provided by the polymeric overhead console 12 as shown in FIG. 3, the finger may cause the overhead console 12 to bend or deform which may cause mechanical deformation of the capacitive sensor 24. The mechanical deformation of the capacitive sensor 24 may result in a deformation of the geometry of the capacitive sensor 24 as it is forced to stretch and change shape and a relatively slow recovery of the shape of the touch pad may affect the signal. In addition, air pockets may be introduced between the sensor circuitry (e.g., ink film) and the touch pad. The changes in the sensor assembly and mechanical properties may affect the capacitive signal as the sensor is pressed with the increased force which may result in false activations if not properly accounted for. The proximity switch assembly 20 as described herein detects the switch activation despite deformation of the proximity sensor.

Figure 5:
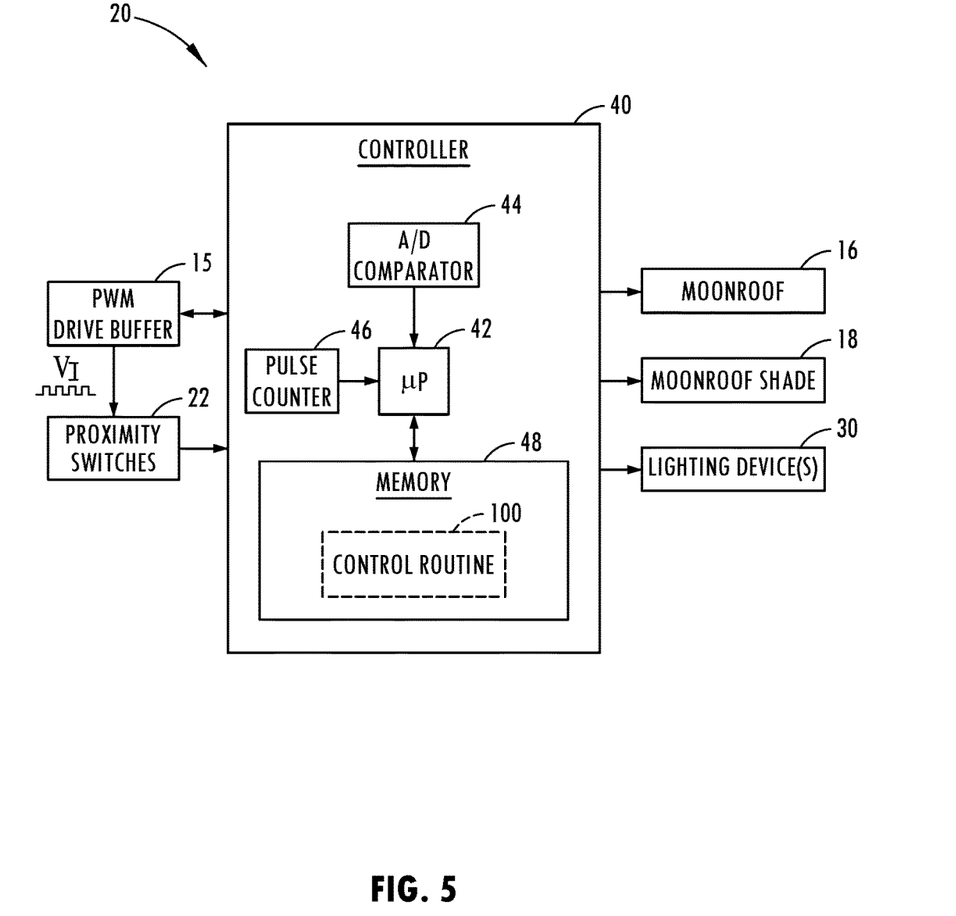
FIG. 5 is a block diagram illustrating the proximity switch assembly, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field signal to one or more thresholds pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, the controller 40 may include a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines 100 stored in memory 48 to monitor and make a determination as to activation of one of the proximity switches. The control routines 100 may include a routine for executing a method of activating a proximity switch using one or more actuation thresholds, stable signal detection, and rate monitoring, and may provide recalibration of the signal count to reduce or eliminate adverse effects caused by condensation as disclosed in U.S. Pat. No. 9,287,864 which is hereby incorporated herein by reference.

Figure 6:
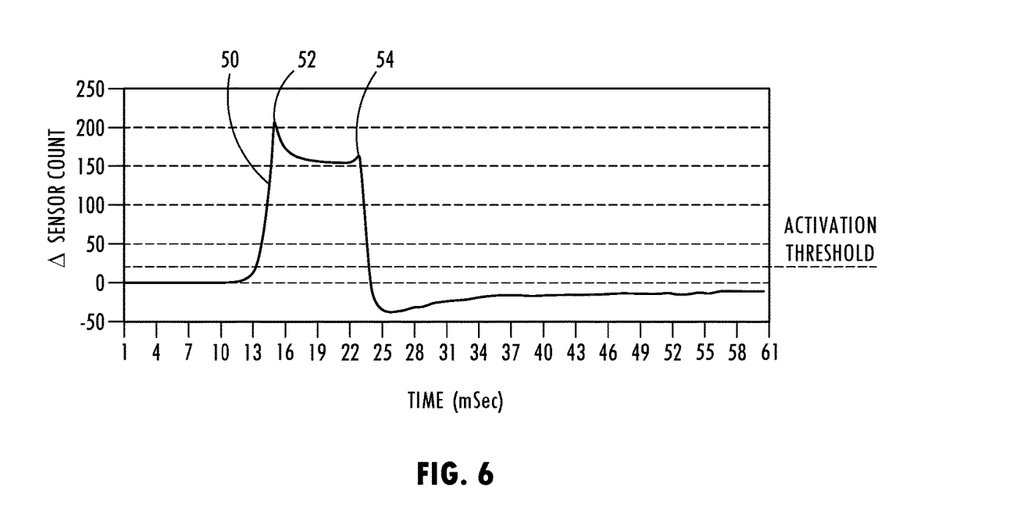
FIG. 6 is a graph illustrating the signal count for a signal channel associated with one of the capacitive sensors showing the signal generated during a touch activation event.
Figure 7:
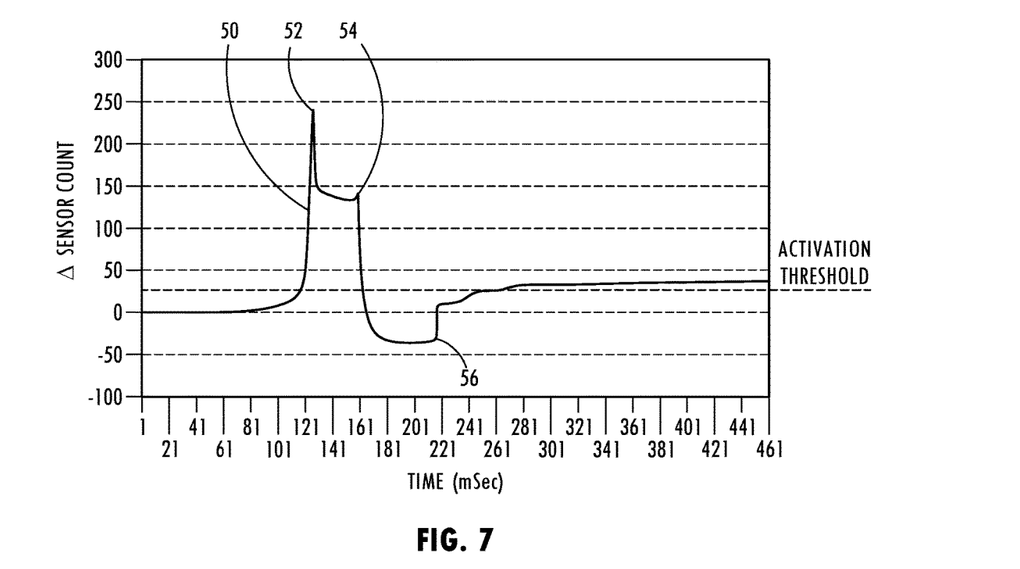
FIG. 7 is a graph illustrating the signal count for a signal channel associated with one of the capacitive sensors showing the signal during a touch activation event with recalibration.
Figure 8:
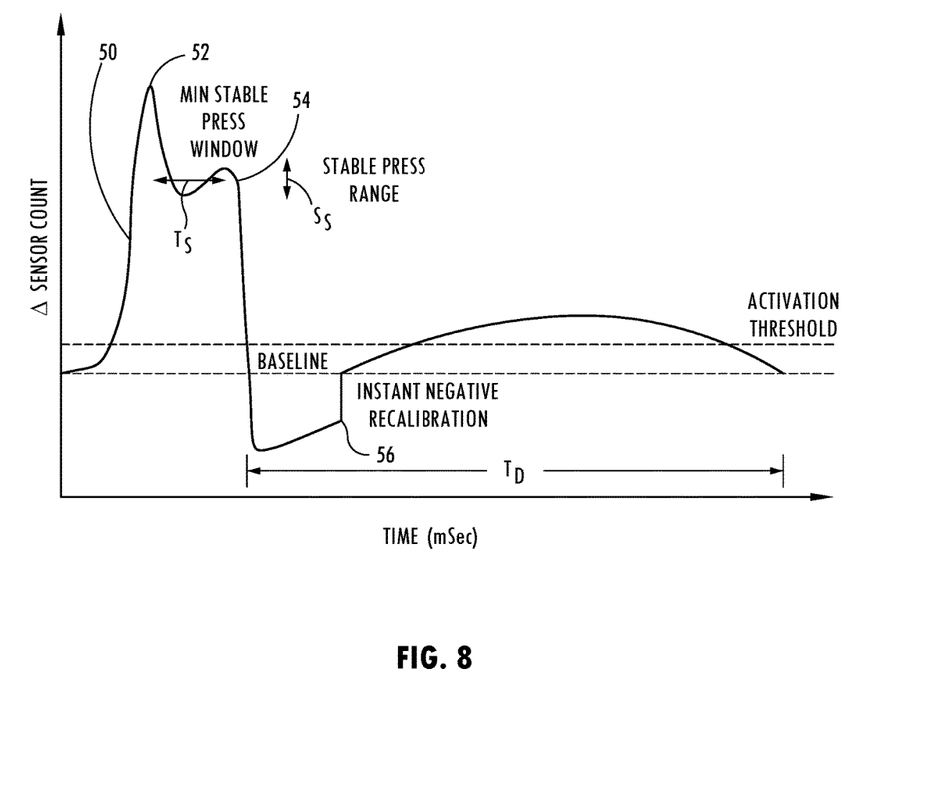
FIG. 8 is a graph illustrating the signal count for a signal channel associated with one of the capacitive sensors showing the signal during a touch activation event.

In FIGS. 6-8 the change in sensor charge pulse counts shown as Δ sensor count for a signal channel associated with a proximity switch 22, such as one of the three switches 22 shown in FIG. 3, is illustrated according to various examples. The change in sensor charge pulse count is the difference between an initialized referenced count value without any finger or other object present in the activation field and the corresponding sensor reading. In these examples, the user's finger enters the activation field 32 associated with a proximity switch 22 and contacts and pushes on the touch pad. In the disclosed embodiment, the proximity sensors 24 are capacitive sensors. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch pad surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

The proximity switch assembly 20 is able to recognize the presence of a user's hand when the hand, particularly a finger, is in close proximity to the proximity switches 22, to determine the intent of the user to activate a switch 22 with a tap or touch activation. The proximity switch assembly 20 may also operate in an exploration or hunting mode which enables the user to explore the keypads or buttons by passing or sliding a finger in close proximity to the switches without triggering an activation of a switch until the user's intent is determined. The proximity switch assembly 20 monitors amplitude of a signal generated in response to the activation field, and determines activation of a switch based on the signal.

The proximity switch assembly 20 is also able to recognize a user's hand contacting the touch pad and to distinguish between a tap or touch activation and a deformation of the capacitive sensor circuitry and recovery of the deformation of the circuitry which may lead to a false activation. When the user presses with force on the touch pad on the overhead console 12, the touch pad and the capacitive sensor circuitry formed thereon may stretch and deform such that the sensor circuit traces stretch and may become separated from the polymeric molding and changes the geometry of the sensor circuitry occur. The polymeric overhead console touch pad and sensor circuitry typically will return to the original non-deformed shape, but the return to the non-deformed shape may occur slowly over time such as a couple of seconds or even more. The changes to the capacitive sensor as the surface deforms and recovers may change the signal generated by the activation field.

Referring to FIG. 6, as the user's finger 34 approaches a proximity switch 22, the finger 34 enters the activation field 32 associated with the proximity sensor 24 which causes disruption to the capacitance, thereby resulting in a sensor count increase as shown by signal 50 having an activation activation motion profile. Signal 50 has a baseline value shown at a Δ sensor count value of zero when there is no user interference with the activation field. When the user's finger approaches and contacts the touch pad during a tap activation, the signal 50 rises to a first peak value at point 52. Increased force by the user's finger on the contact pad bends and therefor deforms the overhead console touch pad and causes stretching and deformation of the circuit traces of the capacitive sensor as the user pushes with force on the sensor touch pad. When this occurs at point 52, the signal will decrease from point 52 due to sensor circuitry deformation. When the user releases the forced contact with the touch pad, the signal rises to a second peak value at point 54 due to the recovery of the shape of the sensor circuitry. As the user releases the forced of contact, the signal 50 rises slightly during recovery of the circuit traces, and then when the user removes the finger such that the finger no longer interferes with the actuation field, the signal decreases and drops below the baseline value due to the capacitive sensor circuit traces slowly recovering to the non-deformed shape over a period of time such as two to five seconds. Absent deformation of the circuit traces, the signal 50 will return to the baseline value of zero. However, due to the circuit deformation, the signal drops below the baseline value of zero and thereafter slowly rises back to the baseline value as the circuitry shape recovers. The recovery may take at least half a second and up to five seconds, according to one example. When the signal 50 drops below the baseline value and does not recover quickly, a recalibration event may occur as shown in FIG. 7 at point 56 which may lead to further false activations of the switch if not accounted for due to the signal exceeding the activation threshold. The proximity switch assembly 20 accounts for the drop below the baseline value due to circuit deformation and recovery and delays activation to prevent recalibration from causing false activations.

Referring to FIG. 8, the determination of an activation of one proximity switch of the proximity switch assembly 20 is further illustrated according to one embodiment. The controller monitors the signal 50 associated with a switch to determine if the signal exceeds a touch activation threshold that records a first peak value at point 52. Next, the controller monitors for a signal drop value from the peak value at point 52 of more than N times the stable range and remains above the activation threshold. The stable range may be a signal range $S_S$ in which the signal is stable or substantially stable over a period of time $T_S$ such as disclosed in U.S. Pat. No. 8,933,708 which is hereby incorporated herein by reference. The value N may be a multiplication factor in the range of two to three, according to one embodiment.

The controller monitors for a small rise in the signal 50 to second peak value 54 followed by a sharp drop in the signal to a signal value below the baseline value of zero, i.e., a negative value. If the total time for the initial activation is less than the maximum time allowed for a tap event, a tap activation is selected. If the total time is more than the maximum time allowed for a tap event, a press activation is selected. Thereafter, if the signal drops below the baseline value, a recalibration may be delayed or disabled or the activation determination delayed for a delay time $T_D$ of at least X seconds, wherein X may be at least two seconds or more preferably, around five seconds, according to one embodiment. The delay in recalibration of the signal or determination of an activator prevents false activations that may otherwise occur.

Figure 9:
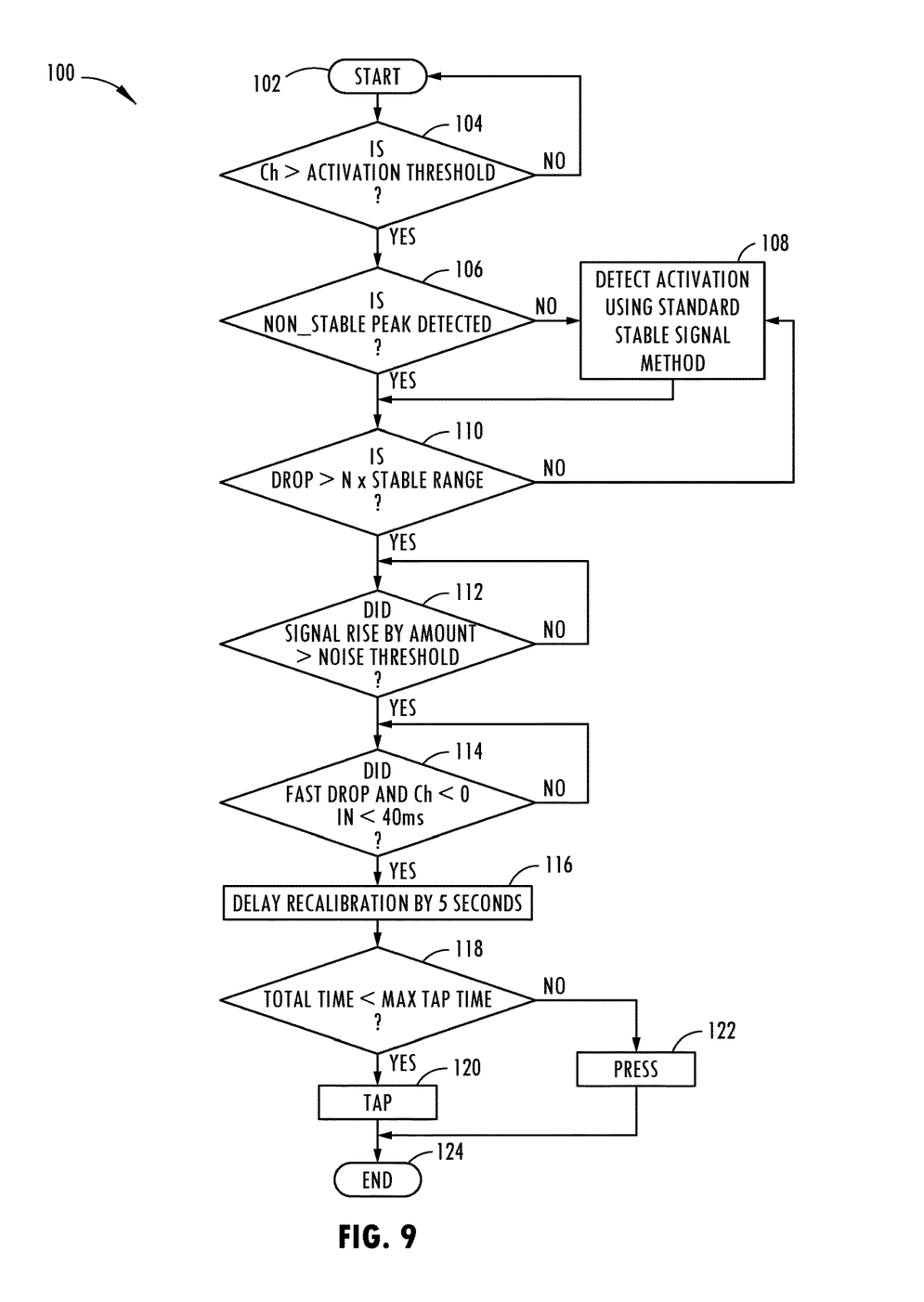
FIG. 9 is a flow diagram illustrating a routine for detecting activation of a capacitive switch, according to one embodiment.

Referring to FIG. 9, the routine 100 for determining activation of the proximity switch assembly 20 is further illustrated according to one embodiment. Routine 100 begins at step 104 to determine if the signal on a signal channel associated with one of the switches is greater than an activation threshold and, if not, returns to start at step 102. If the signal exceeds the activation threshold, routine 100 proceeds to step 106 to determine if a non-stable first peak value is detected and, if not, detects activation using a standard stable signal activation method that may determine switch activation based on a stable signal exceeding a threshold at step 108. If a non-stable first peak value has been detected, routine 100 proceeds to step 110 to determine if the signal drop is greater than N times the stable range and, if not, returns to step 108 to detect activation using the standard stable signal method. If the signal drop is greater than N times the stable range, routine 100 proceeds to step 112 to determine if the signal rises by an amount greater than a noise threshold and, if not, returns to step 112. If the signal rises by an amount greater than the noise threshold, routine 100 proceeds to step 114, to determine if a fast drop in the signal occurs and the signal drops to a value below the baseline value of zero in less than a time of 40 milliseconds, according to one example, and if not, returns to step 114. If the signal drops fast and the signal is less than the baseline value of zero in less than a time period of 40 milliseconds, then routine 100 proceeds to step 116 to delay any recalibration or determination of activation by a time period, such as two to five seconds. The delay in the recalibration or activation determination prevents false activations from being detected due to a calibration while the capacitive sensor circuitry recovers from its deformed shape to its original shape. Next, routine 100 proceeds to step 118 to determine if the total time is less than a maximum time for a tap event to occur and, if so, determines that a tap activation of the capacitive switch has occurred before ending at step 210. If the total time is not less than the maximum tap time, then routine 100 determines that a press activation has occurred at step 120 before ending at step 124.

Accordingly, the proximity switch assembly 20 advantageously monitors a signal generated from activation of a proximity switch and determines activation of the switch during events that may cause deformation of the proximity switch circuitry due to force being applied to the touch pad. The proximity switch assembly advantageously eliminates false activations that may otherwise occur.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A proximity switch assembly comprising:
   a proximity switch comprising a proximity sensor providing an activation field; and
   control circuitry monitoring a signal responsive to the activation field and determining an activation of the switch based on detecting a first peak value above a threshold when the signal is not stable, followed by a drop and a subsequent rise to a second peak value followed by a sharp drop, wherein the control circuitry further delays recalibration of the switch assembly by a predetermined time period when the signal is detected dropping fast.

2. The switch assembly of claim 1, wherein the delay in recalibration is at least two seconds.

3. The switch assembly of claim 1, wherein the control circuitry further determines the signal drops below a baseline value.

4. The switch assembly of claim 1, wherein the drop from the first peak value exceeds a noise threshold.

5. The switch assembly of claim 4, wherein the drop from the first peak value exceeds at least twice the noise threshold.

6. The switch assembly of claim 1, wherein the proximity sensor comprises a sensor circuit formed on a flexible substrate.

7. The switch assembly of claim 1, wherein the proximity switch comprises a capacitive switch comprising a capacitive sensor.

8. The switch assembly of claim 1, wherein the proximity switch is installed in a vehicle for use by a passenger of the vehicle.

9. A method of determining activation of a proximity switch comprising:
   generating an activation field with a proximity sensor;
   monitoring amplitude of a signal generated in response to the activation field;
   detecting a first peak value of the signal when the signal is not stable, followed by a drop in the signal, then a subsequent rise to a second peak value, followed by a sharp drop below a baseline value;
   delaying recalibration of the switch by a fixed time when the signal drops below the baseline value; and
   determining an activation of the switch based on the detecting step.

10. The switch assembly of claim 9, wherein the delay in recalibrating is at least two seconds.

11. The method of claim 9, wherein the drop from the first peak value exceeds a noise threshold.

12. The switch assembly of claim 11, wherein the drop from the first peak value exceeds at least twice the noise threshold.

13. The method of claim 9, wherein the proximity sensor comprises a sensor circuit formed on a flexible substrate.

14. The method of claim 9, wherein the proximity switch comprises a capacitive switch comprising a capacitive sensor.

15. The method of claim 9, wherein the proximity switch is installed on a vehicle for use by a passenger in the vehicle.

* * * * *